United States Patent
Etaati et al.

(10) Patent No.: US 8,958,997 B2
(45) Date of Patent: Feb. 17, 2015

(54) UNINTERRUPTIBLE POWER SUPPLY TESTING

(75) Inventors: Sahba Etaati, Redwood City, CA (US); Stephen K Gee, Santa Clara, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 480 days.

(21) Appl. No.: 13/307,192

(22) Filed: Nov. 30, 2011

(65) Prior Publication Data
US 2013/0138365 A1     May 30, 2013

(51) Int. Cl.
*G01R 31/00*     (2006.01)
*G01R 31/40*     (2014.01)
*G06F 1/00*     (2006.01)

(52) U.S. Cl.
USPC .......................... 702/58; 324/764.01; 713/340

(58) Field of Classification Search
CPC .. G01R 31/40; G01R 19/00; G01R 19/16542; H02J 3/14; H02J 3/38; H02J 1/14; H02J 1/10; H02J 9/00; G06F 1/263; G06F 19/00; G06F 1/26; G06F 1/28; G06F 1/3206
USPC .................. 702/58, 60, 63–64; 324/433, 522, 324/764.01; 700/286, 295, 297; 713/340
See application file for complete search history.

(56) References Cited

U.S. PATENT DOCUMENTS

| | | | |
|---|---|---|---|
| 7,425,779 B2 | 9/2008 | Luo et al. | |
| 7,492,058 B2 | 2/2009 | Chen | |
| 7,652,397 B2 | 1/2010 | Lin et al. | |
| 2006/0138867 A1 | 6/2006 | Tian et al. | |
| 2007/0046281 A1* | 3/2007 | Domingo et al. | 324/142 |
| 2009/0174260 A1 | 7/2009 | Wu et al. | |

OTHER PUBLICATIONS

Shyu et al., UPS Outage-Mode Output Power Capacity Expansion Approach via Bi-Directional Converter, 2005 IEEE, pp. 1497-1502.*

* cited by examiner

*Primary Examiner* — Toan Le
(74) *Attorney, Agent, or Firm* — Aamir Haq

(57) ABSTRACT

A system includes an uninterruptible power supply (UPS), one or more power supplies, and a processing device. The processing device to execute instructions which cause the processing device to determine a total output current of the one or more power supplies, enable the UPS, determine an output current of at least the UPS, determine a current sharing percentage for at least the UPS, and compare the current sharing percentage for the UPS with an expected current sharing percentage range.

20 Claims, 4 Drawing Sheets

UNINTERRUPTIBLE POWER SUPPLY TESTING

BACKGROUND

An uninterruptible power supply (UPS) is generally a device that provides finite power to a load in response to a primary power source failure or disruption. This power ensures that the load and related systems continue operating notwithstanding the power event. For example, an UPS may be used to replace or supplement a primary power source in the event of a power failure (e.g., a blackout) or power sag (e.g., a brownout). This UPS functionality may prevent data loss and downtime in business environments were reliability is critical (e.g., data centers, stock exchanges, etc.), and may safeguard the general public in environments were momentary downtime may result in injury or even loss of life (e.g., emergency call centers, military installations, etc.). Furthermore, this UPS functionality may keep power flowing to devices long enough for all data to be saved and for the devices to be shut down properly. UPS technology, therefore, while often overlooked and in the background, plays a central role in reliably delivering services in almost every technology space.

BRIEF DESCRIPTION OF THE DRAWINGS

Example embodiments are described in the following detailed description and in reference to the drawings, in which.

DETAILED DESCRIPTION

Figure 1:
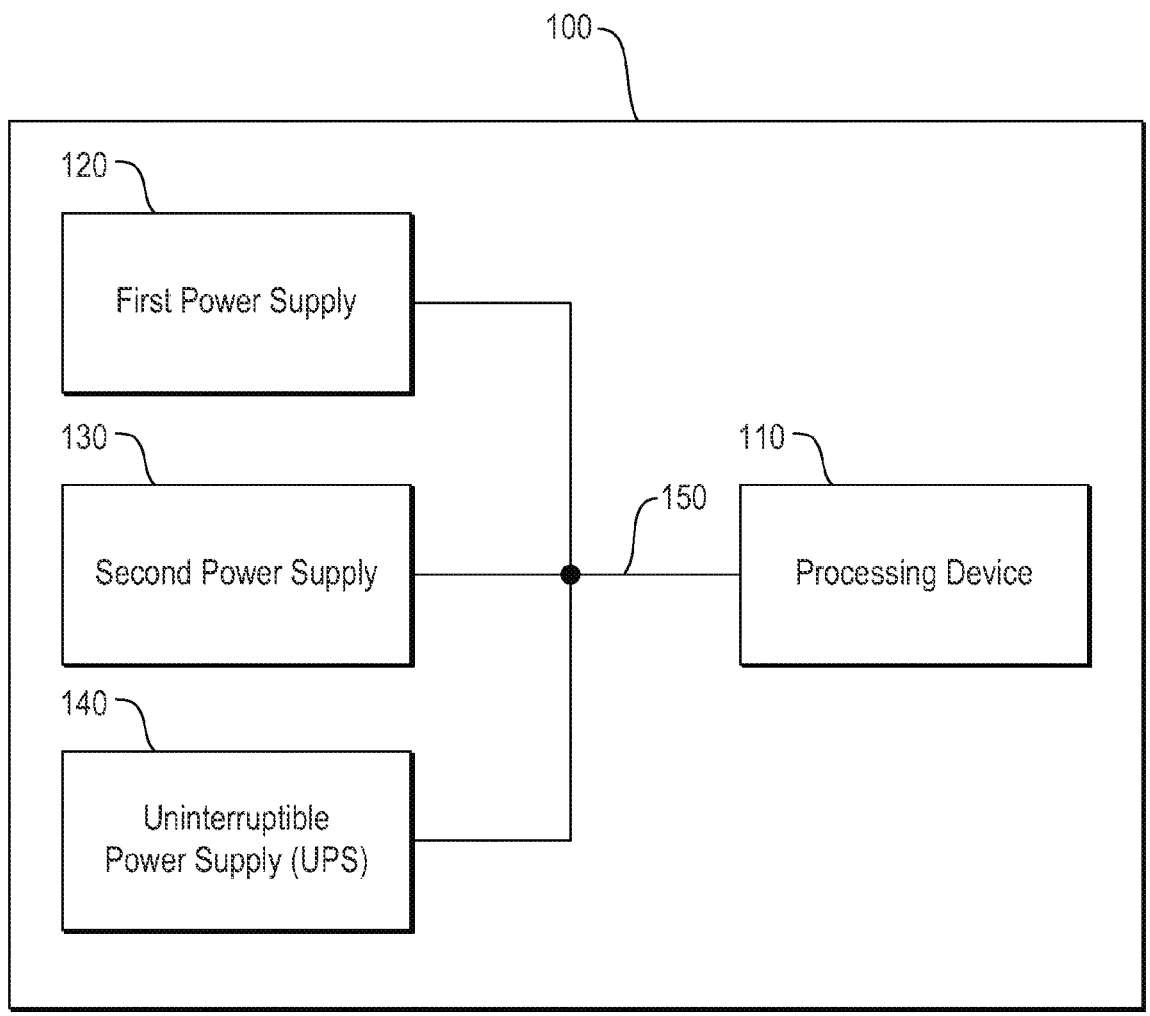
FIG. 1 depicts an example system in accordance with embodiments.

For simplicity and illustrative purposes, the present disclosure is described by referring mainly to examples thereof. In the following description, numerous specific details are set forth in order to provide a thorough understanding of the present disclosure. It will be readily apparent, however, that the present disclosure may be practiced without limitation to these specific details. In other instances, some methods and structures have not been described in detail so as not to unnecessarily obscure the present disclosure.

As used herein, the term "includes" means includes but not limited to, and the term "including" means including but not limited to. The term "based on" means based at least in part on.

Various embodiments described herein provide a novel and previously unforeseen approach to UPS testing. In particular, embodiments describe a safe and reliable approach to determine if an UPS is operating as expected. This testing is valuable because it provides an early warning that an UPS may not be functioning as expected, instead of coming to this realization after a power event has occurred. The UPS may therefore be serviced and/or replaced in advance of a power event which may require the UPS to be fully operational.

As discussed below, while there are a few current approaches to test UPS functionality, these approaches suffer a number of drawbacks and often introduce undesirable risk to system stability.

One current UPS testing approach utilizes a small resistive load (i.e., "bleeder load") in the UPS circuitry to test UPS functionality. The resistive load periodically draws current from a cell in the UPS to confirm that the cell is capable of providing power in the event of a power outage or sag. One problem with this approach, however, is that due to cost, space, and/or thermal considerations, the resistive load is typically not representative of the actual load that may be present in the event of a power failure. This testing approach, therefore, fails to credibly confirm that the UPS can sustain a full system load in response to a power event. Embodiments of the present disclosure described below may overcome this issue by utilizing larger loads or even the same load as may be required when the UPS is the sole power source. Additionally, unlike bleeder load approaches that are typically performed behind the last stage of the UPS (i.e., before mating with the main power bus), embodiments may test the full path of the power bus and therefore be more representative of actual UPS operation.

Another current UPS testing approach is to perform a sudden switchover from the primary power source to the UPS. That is, the approach mimics a blackout situation in which all primary power is lost and the UPS must immediately function at full levels. While this sudden switchover approach may be representative of a full load, it is problematic and quite dangerous because the UPS may not be functional at the time of the sudden switchover, and therefore may not provide immediate backup power as expected. Stated differently, the sudden switchover testing approach introduces risk because it may create an unintentional fault in the system if the UPS is not fully functional. Embodiments of the present disclosure described below may mitigate this risk by testing the UPS in a staggered or shared approach that may not require the UPS to immediately be the sole power provider.

In certain embodiments of the present disclosure, a system is provided. The system may comprise an UPS, one or more power supplies, and a processing device. The processing device is configured to execute instructions that cause the processing device to determine a total output current of the one or more power supplies, enable the UPS, and determine an output current of at least the UPS. Further, the processing device may execute instructions that cause the processing device to determine a current sharing percentage for at least the UPS, and compare the current sharing percentage for the UPS with an expected current sharing percentage range. In some embodiments, the processing device may determine that the UPS is functioning properly based at least in part on whether or not the current sharing percentage for the UPS is consistent with the expected current sharing percentage range. In other embodiments, the processing device may determine that the UPS is not functioning properly if the current sharing percentage for the UPS is not consistent with the expected current sharing percentage range. Furthermore, as part of the USP testing process, the processing device may determine if components associated with the UPS are functioning properly. For example, the processing device may determine if a fan or another cooling mechanism associated with the UPS is functioning. Also, as part of the UPS testing process, the processing device may determine internal voltage levels and/or test the UPS charging components.

In other embodiments of the present disclosure, a method is provided. The method may comprise enabling an UPS, determining an output current of the UPS, determining a current sharing percentage for the UPS based at least in part on the output current of the UPS, retrieving an expected current sharing percentage range for the UPS, and comparing the current sharing percentage for the UPS with the expected current sharing percentage range. Additionally, the operations may include determining that the UPS is not functioning properly and/or causing an indication to be provided if the current sharing percentage for the UPS is not consistent with the expected current sharing percentage range.

In further embodiments of the present disclosure, a non-transitory computer readable medium is provided. The computer readable medium may have instructions stored therein that when executed cause a processing device to enable an UPS, determine an output current of the UPS, determine a current sharing percentage for the UPS, compare the current sharing percentage for the UPS with an expected current sharing percentage range, and determine if the UPS is functioning based at least in part on a result of comparing the current sharing percentage for the UPS with the expected current sharing percentage range. Additionally, the instructions may further cause the processing device to determine if one or more components associated with the UPS are functioning. In some embodiments, the instructions may further cause the processing device to disable a power supply, determine a second current sharing percentage for the UPS, and compare the second current sharing percentage for the UPS with a second expected current sharing percentage range. The instructions may then cause the processing device to determine if the UPS is functioning based at least in part on a result of comparing the second current sharing percentage for the UPS with the second expected current sharing percentage range.

FIG. 1 depicts an example system 100 in accordance with embodiments. It should be readily apparent that the system depicted in FIG. 1 represents a generalized illustration and that other components may be added or existing components may be removed, modified or rearranged without departing from a scope of the present disclosure. For example, while two power supplies are shown in FIG. 1 and referenced throughout the remainder of this disclosure, the system 100 may comprise more or less power supplies in accordance with embodiments.

The system 100 may form at least part of one or more devices that benefit from and/or provide uninterrupted power. For example, the system 100 may form at least part of a storage device, a server, a switch, a router, a power supply, and/or a client device. As shown, the system 100 may comprise a processing device 110, a first power supply 120, a second power supply 130, an UPS 140, and a power bus 150. In some embodiments, the first power supply 120, second power supply 130, and UPS 140 may be arranged in a parallel configuration (as opposed to a series configuration), where the output of the first power supply 120, second power supply 130, and the UPS 140 are tied together and provide power along the power bus 150.

The processing device 110 may be one or more devices configured to carry out operations by executing instructions stored on an internal or external non-transitory computer-readable medium. For example, the processing device 110 may be one or more of a microprocessor, a central processing unit (CPU), a processor, a microcontroller, and an application-specific integrated circuit (ASIC). The non-transitory computer-readable medium may be, for example, a non-volatile memory, a volatile memory, and/or one or more storage devices. Examples of non-volatile memory include, but are not limited to, electronically erasable programmable read only memory (EEPROM) and read only memory (ROM). Examples of volatile memory include, but are not limited to, static random access memory (SRAM) and dynamic random access memory (DRAM). Examples of storage devices include, but are not limited to, hard disk drives, compact disc drives, digital versatile disc drives, optical devices, and flash memory devices. The processing device 110 may reside on a printed circuit board (PCB) and be electronically coupled to the first power supply 120, second power supply 130, and UPS 140 via at least the power bus 150.

The first power supply 120 and second power supply 130 may comprise one or more components configured to provide electrical energy to one or more electrical loads. Such components may include converters (e.g., AC/DC and DC/DC), inverters, transformers, rectifiers, capacitors, resistors, inductors, diodes, linear regulators, boost regulators, and/or buck regulators. In addition, the power supplies may include protection components such as fuses or circuit breakers for overload protection, and circuitry configured to measure current and/or voltage levels. The power supplies may provide direct current (DC) or alternating current (AC) to one or more loads. Further, the power supplies may provide a plurality of voltages (e.g., +12V, −12V, +5V, −5V, +3.3V, etc.). This may be accomplished via rectification, filtering, regulation, and/or isolation. The power supplies may be linear power supplies or switching power supplies. In some embodiments, the power supplies may comprise a plurality of power supplies, where each power supply is configured to produce a voltage component that may be output based on component power requirements.

The UPS 140 may provide short-term power via internal cells in response to a failure or disruption of the first power supply 120 and/or second power supply 130. For instance, the UPS 140 may be used to replace or supplement the first power supply 120 and/or second power supply 130 in the event of a power failure (e.g., a blackout) or power sag (e.g., a brownout). Upon switchover back to the first power supply 120 and/or second power supply 130, the UPS 140 may be configured to recharge its internal cells.

The UPS 140 may comprise a plurality of components such as one or more cells, charging circuitry, and/or protection circuitry. The one or more cells may be, for example, flow batteries, lead-acid batteries, lithium air batteries, lithium-ion batteries, lithium iron phosphate batteries, lithium-sulfur batteries, lithium-titanate batteries, molten salt batteries, nickel-cadium batteries, nickel hydrogen batteries, nickel-iron batteries, nickel metal hydride batteries, nickel-zinc batteries, organic radical batteries, polymer-based batteries, polysulfide bromide batteries, potassium-ion batteries, alkaline batteries, silicon air batteries, sodium-ion batteries, super iron batteries, zinc-bromine flow batteries, zinc matrix batteries, or a combination thereof.

In some embodiments, the UPS 140 may connect to an AC power socket. The UPS 140 may convert the AC to DC with an AC/DC converter, and charge the internal cell(s) with the DC power. Alternatively or in addition, the UPS 140 may utilize DC power received via the first power supply 120 and/or second power supply 130 to charge internal cell(s). The UPS 140 may charge the internal cell(s) based on the received power, and may comprise a charge circuit designed to maximize the lifetime of the cells in float duty. This may comprise a two-step constant current/constant voltage charge.

The UPS 140 may provide an output voltage consistent with the output voltage provided by the first power supply 120 and/or second power supply 130. For example, if the first power supply 120 and the second power supply 130 provide +12V output, the UPS 140 may similarly provide +12V output when enabled. Additionally, the UPS 140 may be configured to take over the full load from the first power supply 120 and second power supply 130 if necessary. For example, if the first power supply 120 and second power supply 130 provide 500 W to the load, the UPS 140 may provide 500 W to the load for a finite time period.

The UPS 140 may include a microcontroller and associated circuitry in some embodiments. The microcontroller may be configured to conduct analog/digital measurements, such as measuring the battery voltage (open circuit), battery voltage (charging and discharging), battery current (charging and discharging), ambient temperature, battery cell temperature, and/or the UPS output current/voltage when enabled. The microcontroller may further be configured to determine the status of components such as one or more fans associated with the UPS 140. In some embodiments, the above-mentioned functions may be accomplished via internal or external circuitry without use of a microcontroller internal to the UPS.

The first power supply 120, second power supply 130, and UPS 140 may be in a power sharing environment in various embodiments. That is, the load may be "equally" shared by the first power supply 120, second power supply 130, and/or UPS 140 when each is active. For example, if the first power supply 120, second power supply 130, and UPS 140 are all enabled, each should theoretically provide ⅓ of the current required by the load. By contrast, if only the first power supply 120 and the second power supply 130 are active, each should theoretically provide ½ of the current required by the load.

The power sharing may be based on either active current sharing techniques or passive current sharing techniques. Active current sharing may utilize circuitry to actively measure, e.g., phase currents, and actively adapt drive signals such that current share imbalances between the first power supply 120, second power supply 130, and/or UPS 140 are minimized. In general, current imbalances may be +/−10% or less in embodiments where active current sharing is utilized. Passive current sharing, by contrast, may rely on internal and/or external resistances to distribute current relatively evenly and may involve matching drive signals and power handling components. Imbalances for passive current sharing are generally greater than with active current sharing, and may be +/−30% or less when passive current sharing is utilized.

Turning now to system 100 operations, below is a description of how the above-described system components may perform UPS testing in certain embodiments. In particular, the processing device 110 may test UPS functionality by initially determining a total output current of the one or more power supplies. That is, while the UPS is not actively providing power, the processing device 110 may determine the total amount of current output by the power supplies. This may be accomplished by the processing device 110, e.g., polling, sensing, or otherwise receiving current measurements from a current sensing circuit internal or external to each of the one or more power supplies. For instance, the processing device 110 may receive a 15 A current measurement for each of the first power supply 120 and the second power supply 130, and determine that the total output current is 30 A. In some embodiments, this total output current value may be based on an average of multiple measurements over a time period. For example, the processing device 110 may receive current measurements for the first power supply 120 and the second power supply 130 every second for 30 seconds and the average value may represent the total output current.

After determining the total output current of the one or more power supplies (the first power supply 120 and second power supply 130 in this example), the processing device 110 may enable or turn "on" the UPS. Upon its initialization (typically a few milliseconds), the UPS will begin supplying power to the load. The processing device 110 may then proceed to determine the amount of current output by the UPS 140. In particular, the processing device 110 may poll, sense, or otherwise receive current measurements from a current sensing circuit internal or external to the UPS 140. In embodiments, the output current of the UPS 140 may be based on an average of multiple measurements over a time period. For example, the processing device 110 may receive current measurements for the UPS 140 every second for 30 seconds and the average value may be the output current of the UPS 140. Furthermore, the processing device may additionally receive output current measurements for the one or more power supplies which are also supplying power to the load as part of the process. The processing device 110 may therefore have at least (i) a total output current measurement prior to the UPS being enabled (in some embodiments, this measurement may occur after the UPS is enabled), and (ii) an output current measurement for the UPS once enabled.

Upon receiving the output current measurement of the UPS, the processing device 110 may determine a current sharing percentage for at least the UPS 140 based on the determined measurements. For example, if the total determined output current is 30 A and the determined output current for the UPS 140 is 10 A, the processing device 110 may determine that the current sharing percentage for the UPS is 33% (i.e., 10 A/30 A). The processing device 110 may further determine the current sharing percentages for the one or more power supplies. For example, if the total output current is 30 A and the output current for the first power supply 120 is 10 A and the second power supply 130 is 10 A, the processing device 110 may determine that the current sharing percentage for each power supply is 33%.

After determining the current sharing percentage for the UPS 140, the processing device 110 may then compare the current sharing percentage for the UPS 140 with an expected current sharing percentage range. This expected current sharing percentage range may be a value previously stored in the processing device 110 or in a memory associated with and accessible by the processing device 110. The range may signify the expected UPS current output percentage in view of the number of enabled devices providing power and the type of current sharing utilized. For instance, if two power supplies and the UPS are enabled (i.e., 3 devices providing power) and active current sharing is utilized (i.e., +/−10% variance), the expected current sharing percentage range for the UPS may be 33%+/−10% (i.e., a range of 29.7%-36.3%). If one power supply and the UPS are enabled (i.e., 2 devices providing power) and active current sharing is utilized (i.e., +/−10% variance), the expected current sharing percentage range for the UPS may be 50%+/−10% (i.e., a range of 45.0%-55.0%). By contrast, if two power supplies and the UPS are enabled and passive current sharing is utilized (i.e., +/−30% variance), the expected current sharing percentage range for the UPS may be 33%+/−30% (i.e., a range of 23.1%-42.9%).

Based on comparing the actual and expected current sharing percentages, the processing device 110 may determine that the UPS is not functioning properly if the current sharing percentage for the UPS is not consistent with the expected current sharing percentage range. For example, if the current sharing percentage for the UPS is 15% and the expected current sharing percentage range for the UPS is 33%+/−10%, the processing device 110 may determine that the UPS is not functioning properly because the UPS is providing less than the expected amount of current. This may be due to, e.g., a faulty charge circuit, a faulty cell, or another faulty UPS component. By contrast, the processing device 110 may determine that the UPS is functioning properly based at least in park on whether or not the current sharing percentage for the UPS is consistent with the expected current sharing percentage range. For example, if the current sharing percentage for the UPS is 31% and the expected current sharing percentage 33%+/−10%, the processing device 110 may determine that the UPS is functioning properly because the UPS is providing the expected amount of current.

In some embodiments, the decision that the UPS is functioning properly may also take into consideration other measurements and/or the status of other components. For example, even if the current sharing percentage is commensurate with the expected range, the processing device 110 may nonetheless determine that the UPS is not functioning properly if a fan is not functioning and/or a measured internal voltage level is not as expected.

In the event that the processing device 110 determines that the UPS is not functioning properly, the processing device 110 may conduct a variety of operations. Such operations may include, e.g., causing an indication to be provided to inform a user or multiple users that the UPS 140 may not be functioning as expected and should be serviced. This indication may be in the form of, e.g., an illuminated light emitting device (LED); a message appearing on a management liquid crystal display (LCD), system, console or graphical user interface (GUI); and/or an audible signal. Further, the indication may be provided locally or remotely to one or more locations via a network.

Figure 2:
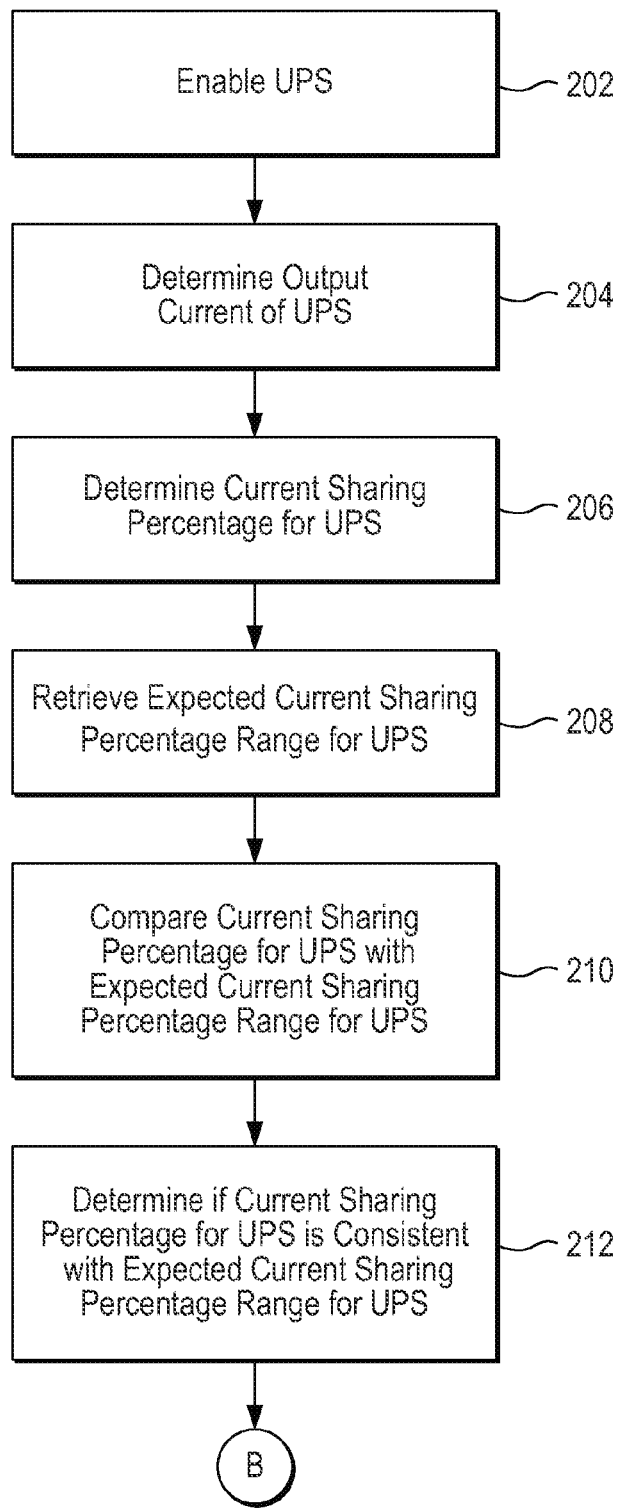
FIG. 2 depicts a process flow diagram of a method for testing the functionality of an UPS in accordance with embodiments.

FIG. 2 depicts a process flow diagram of a method 200 for testing the functionality of the UPS 140 in accordance with embodiments. The method may be performed by the processing device 110 as shown in FIG. 1. In particular, the illustrated elements denote "processing blocks" that may be implemented in logic. In one example, the processing blocks may represent executable instructions that cause the processing device 110 to respond, to perform an action(s), to change states, and/or to make decisions. Thus, described methodologies may be implemented as processor executable instructions and/or operations provided by a computer-readable medium. In another example, processing blocks may represent functions and/or actions performed by functionally equivalent circuits like an analog circuit, a digital signal processor circuit, an application specific integrated circuit (ASIC), or other logic devices. FIG. 2, as well as the other figures, is not intended to limit the implementation of the described examples. Rather, the figures illustrate functional information one skilled in the art could use to design/fabricate circuits, generate software, or use a combination of hardware and software to perform the illustrated processing.

The method 200 may begin at block 202, wherein the processing device 110 enables the UPS 140. This may be effectuated by the processing device 110, e.g., driving an output signal to a level that triggers the UPS 140 to begin providing power, or via a "turn-on command" communicated between the processing device 110 and the UPS 140. As mentioned above, the UPS 140 may actively or passively current share with the one or more power sources (e.g., 120 and 130) such that each is providing an "equal" amount of current to the load. Stated differently, the load will obtain an "equal" amount of current from the UPS 140 and the one or more power sources (e.g., 120 and 130) when all are enabled. Depending on the type of current sharing (active or passive) the current imbalance between UPS and one or more power sources may vary, with active current sharing typically providing a more equal current distribution than passive current sharing At block 204, the processing device 110 may proceed to determine the output current for the UPS 140. This may be accomplished by the processing device 110 receiving a plurality of output current measurements over a period of time and calculating an average of the measurements. For example, the processing device 110 may receive a plurality of UPS output current measurements in a predetermined time period and determine the average of the measurements. Furthermore, the measurements may be taken by a current measuring circuit internal or external to the UPS 140. The result of these measurements may be provided to the processing device 110.

At block 206, the processing device 110 may determine a current sharing percentage for the UPS 140 based at least in part on the output current of the UPS 140, as determined in block 204. This percentage is the amount of current that the UPS 140 provides to the load out of the total amount of current being provided to the load. For example, if two power supplies and the UPS 140 provide a total of 30 A to the load and the UPS provides 10 A, then the current sharing percentage for the UPS is 33.33% (i.e., 10 A/30 A). In embodiments, this determination may involve the processing device 110 measuring the total current output to the load either before and/or after the UPS is enabled. This total current output to the load may be based on an average of multiple measurements.

At block 208, the processing device 110 may retrieve an expected current sharing percentage range for the UPS 140. The range may be previously stored in an internal memory of the processing device 110 or in an external memory accessible by the processing device 110. The ranges may be determined in advance by system designers, the computing device 110, and/or another device based on calculations and/or actual measurements. This determination may take into account whether active or passive current sharing is implemented, and the amount of enabled power sources. For example, if active current sharing is implemented with two power sources (other than the UPS), the expected current sharing percentage range for the UPS may be 33%+/−10% (i.e., 29.7%-36.3%). By contrast, if passive current sharing is implemented, the expected current sharing percentage range for the UPS may be 33%+/−30% (i.e., 23.1%-42.9%).

At block 210, the processing device 110 may compare the current sharing percentage for the UPS 140 with the expected current sharing percentage range for the UPS 140. For example, the processing device 110 may determine that the current sharing percentage for the UPS is 33.33% in block 206 and compare this value with an expected range of 33%+/− 10% (i.e., 29.7%-36.3%) as determined in block 208.

At block 212, the processing device 110 may determine if the current sharing percentage for the UPS 140 is consistent with the expected current sharing percentage range for the UPS 140. If the values are not consistent (i.e., the actual value is outside of the expected range), the processing device 110 may determine that the UPS is not functioning properly. This may be the case if the UPS is providing more or less than the expected current sharing percentage (e.g., due to a faulty charge circuit). In response to this determination, the processing device 110 may transmit an alert or otherwise make one or more users or devices aware that the UPS 140 may not be functioning properly and should be serviced.

Additionally, at any point before, during, or after the above-mentioned processes, the processing device 110 may test the functionality and/or obtain the status of other components associated with the UPS (e.g., check that status of an internal fan). Additionally, the processing device 110 may obtain internal/external voltage, current, temperature, vibration and/or humidity levels. These levels and/or the status of the various components may be used by the processing device 110 along with the above-described UPS current sharing analysis to determine if the UPS is functioning as expected and/or is consistent with the UPS specification.

Figure 3:
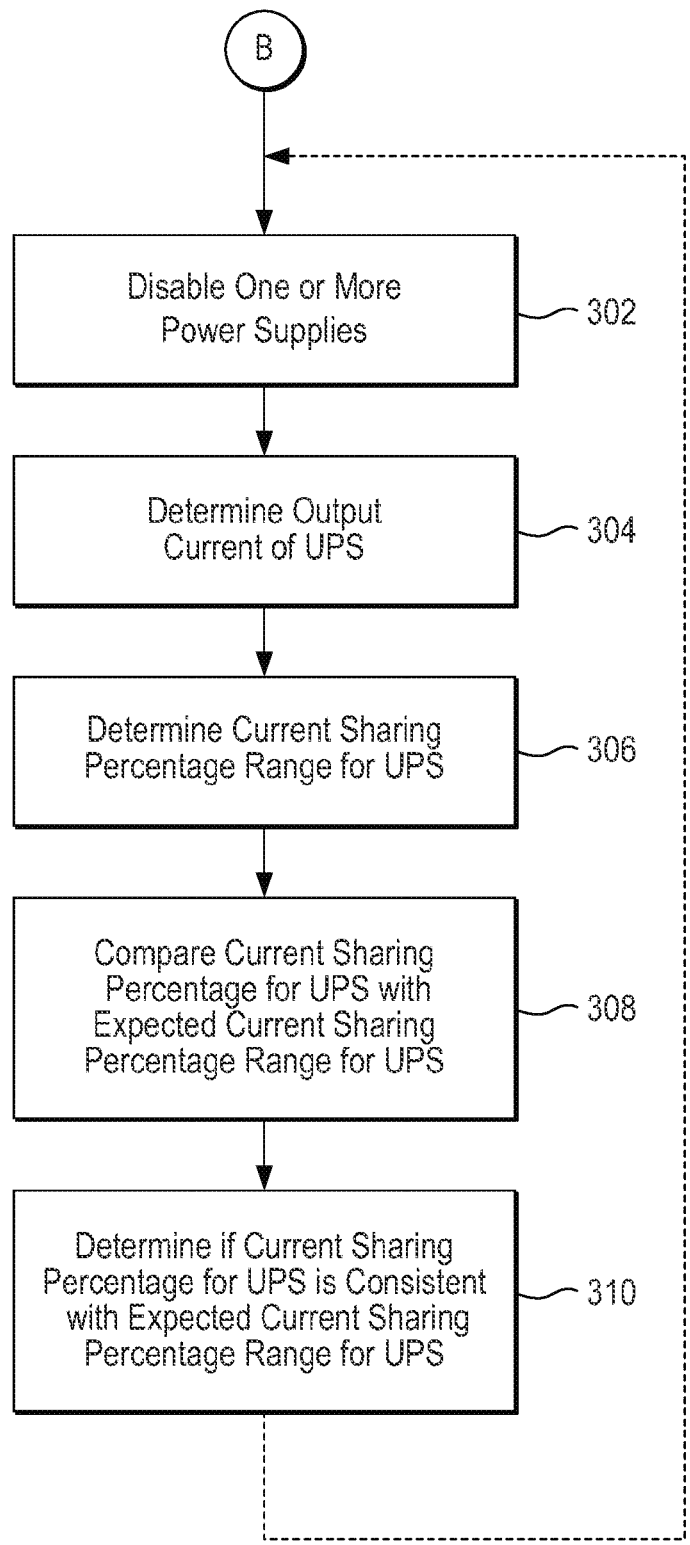
FIG. 3 depicts a process flow diagram of a method for testing the functionality of an UPS in accordance with embodiments.

FIG. 3 depicts a process flow diagram of additional processes that may be conducted in accordance with embodiments after one or more of the processes described with respect to FIG. 2 have been executed. The method 300 of FIG. 3 may be performed by the processing device 110 as shown in FIG. 1.

At block 302, the processing device 110 may disable or turn off one or more power supplies. For example, if there are currently two power supplies and an UPS providing power, the processing device 110 may disable one of the two power supplies. As a consequence, the load will be powered by only the UPS and one power supply.

At block 304, the processing device 110 may determine the output current for the UPS 140 after the power supply is disabled. This may be accomplished by the processing device 110 receiving a plurality of output current measurements over a period of time and calculating an average of the measurements. The measurements may be taken by a current measuring circuit internal or external to the UPS 140.

At block 306, the processing device 110 may determine a current sharing percentage for the UPS 140 based at least in part on the output current of the UPS 140, as determined in block 304. In embodiments, this determination may involve the processing device 110 measuring the total current and comparing the amount the UPS provided with the total amount.

At block 308, the processing device 110 may compare the current sharing percentage for the UPS with an expected current sharing percentage range. This range may be based on the total amount of enabled power supplies. For example, if one power supply and the UPS are enabled, the expected current sharing percentage may be 50%+/−10%. If no power supplies are enabled and the UPS is providing all the power to the load, the expected current sharing percentage may be 100%. These expected current sharing percentages may be previously stored in a memory internal to or external from the processing device 110.

At block 310, the processing device 110 may determine if the current sharing percentage for the UPS 140 is consistent with the expected current sharing percentage range for the UPS 140. If the values are not consistent (i.e., the actual value is outside of the expected range), the processing device 110 may determine that the UPS is not functioning properly. In response to such a determination, the processing device 110 may cause an indication to be provided indicating that the UPS 140 may not be functioning properly and should be serviced.

As shown in FIG. 3, the process may proceed to revert back to block 302 to disable more power supplies and continue UPS testing. This iterative approach enables the power supplies to be disabled, e.g., one-by-one and the UPS to be tested after each power supply is disabled to ensure that the UPS is functioning properly with the revised load. Hence, the testing approach does not risk a self inflicted system fault by switching to full UPS operation during testing, but rather may test the UPS functionality with all the power supplies running (as described in FIG. 2) and then disable one or more power supplies in an iterative fashion with UPS testing occurring at each iteration (as described in FIG. 3). In the end, this approach may indeed lead to the UPS providing all the power to the load, but it will utilize a staggered approach that enables the UPS to provide an incremental amount more power each iteration rather than switching from "off" to full power like in conventional approaches.

Figure 4:
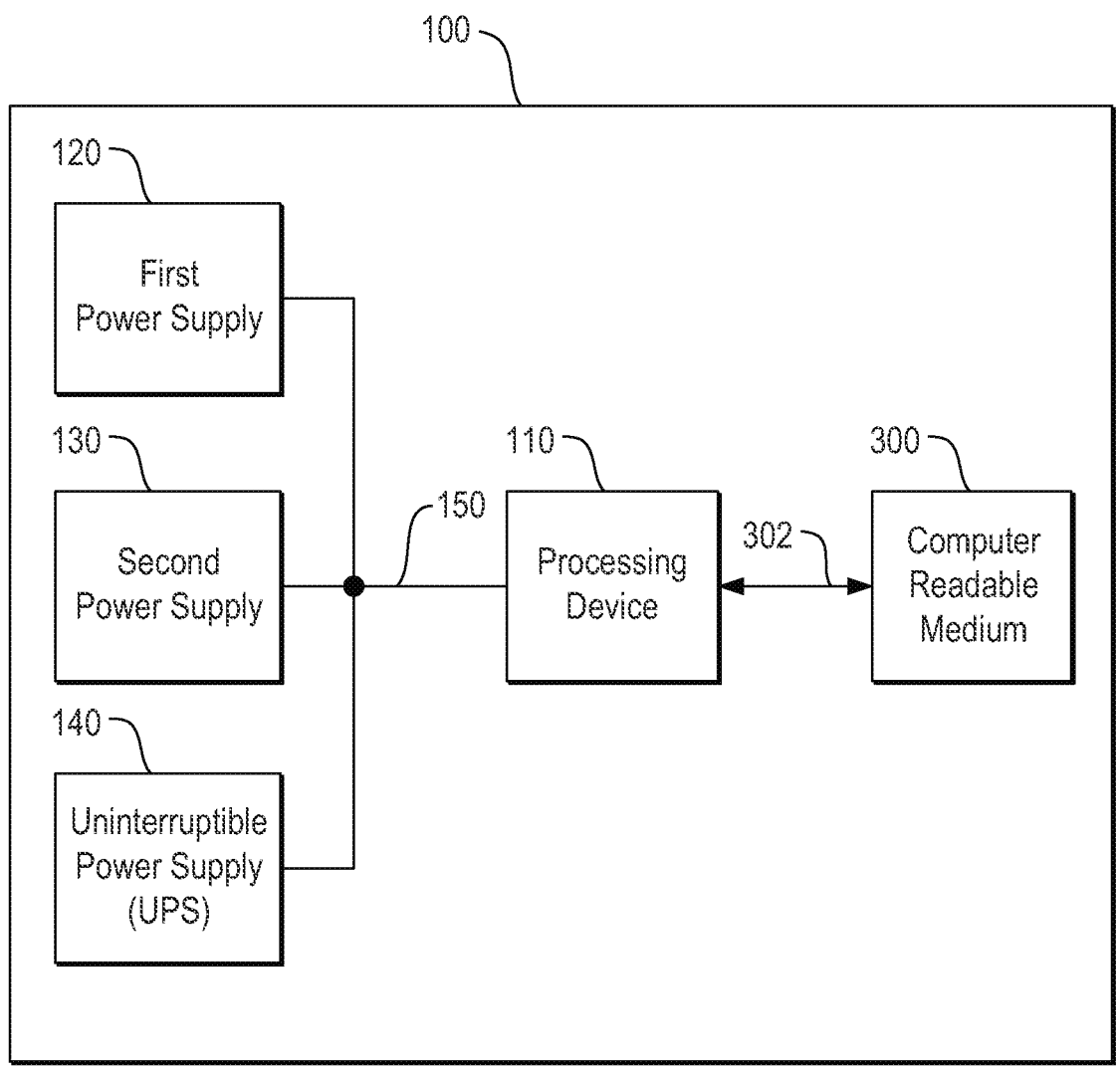
FIG. 4 depicts a block diagram showing a non-transitory computer-readable medium that stores machine readable instructions for testing UPS functionality in accordance with embodiments.

Turning now to FIG. 4, there is shown a block diagram showing a non-transitory computer-readable medium 300 that stores machine readable instructions for testing UPS functionality in accordance with embodiments. The non-transitory computer-readable 300 may be located within system 100 as referenced in FIG. 1, and may correspond to any typical storage device that stores instructions, codes, data, or other information. For example, the non-transitory computer-readable medium 300 may be one or more of a non-volatile memory, a volatile memory, and/or one or more storage devices. Examples of non-volatile memory include, but are not limited to, electronically erasable programmable read only memory (EEPROM) and read only memory (ROM). Examples of volatile memory include, but are not limited to, static random access memory (SRAM), and dynamic random access memory (DRAM). Examples of storage devices include, but are not limited to, hard disk drives, compact disc drives, digital versatile disc drives, optical devices, and flash memory devices.

A processing device 110 generally retrieves and executes the instructions stored in the non-transitory computer-readable medium 300. In embodiments, the non-transitory computer-readable medium 300 may be accessed by the processing device 110 over a bus 302. In other embodiments, the non-transitory computer-readable medium 300 may be integrated with the processing device 302. The processing device 110 may be electronically coupled to the first power supply 120, second power supply 130, and UPS 140 via a power bus 150.

The computer-readable medium 300 may store instructions that, when executed by the processing device 302, cause the above-described operations discussed with respect to FIGS. 1-3 to occur. For example, the instructions, when executed may cause at least one processing device to enable the UPS, determine the output current of the UPS, determine a current sharing percentage for the UPS, compare the current sharing percentage for the UPS with an expected current sharing percentage range, and determine if the UPS is functioning based at least in part on a result of comparing the current sharing percentage for the UPS with the expected current sharing percentage range. Additionally, the instructions may further cause the at least one processing device to determine if one or more components associated with the UPS are functioning.

In some embodiments, the instructions may further cause the at least one processing device to turn off a power supply, determine a second current sharing percentage for the UPS, and compare the second current sharing percentage for the UPS with a second expected current sharing percentage range. The instructions may determine if the UPS is functioning based at east in part on a result of comparing the second current sharing percentage for the UPS with the second expected current sharing percentage range.

The present disclosure has been shown and described with reference to the foregoing exemplary embodiments. It is to be understood, however, that other forms, details, and embodiments may be made without departing from the spirit and scope of the disclosure that is defined in the following claims.

What is claimed is:

1. A system comprising:
   an uninterruptible power supply capable of providing power via internal cells in response to a power failure or power sag;
   one or more power supplies, wherein the uninterruptible power supply is capable of taking over a full load from the one or more power supplies; and
   a processing device to execute instructions which cause the processing device to
      determine a total output current of the one or more enabled power supplies;
      enable the uninterruptible power supply;
      iteratively disable at least one of the one or more power supplies while allowing at least one power supply to remain enabled;
      determine an output current of at least the uninterruptible power supply after the at least one power supply is disabled;
      determine a current sharing percentage for at least the uninterruptible power supply; and
      compare the current sharing percentage for the uninterruptible power supply with an expected current sharing percentage range based on an amount of the at least one or more enabled power supplies.

2. The system of claim 1, wherein the processing device executes further instructions which cause the processing device to determine that the uninterruptible power supply is functioning properly based at least in part on whether or not the current sharing percentage for the uninterruptible power supply is consistent with the expected current sharing percentage range.

3. The system of claim 1, wherein the processing device executes further instructions which cause the processing device to determine that the uninterruptible power supply is not functioning properly if the current sharing percentage for the uninterruptible power supply is not consistent with the expected current sharing percentage range.

4. The system of claim 1, wherein the processing device executes further instructions which cause the processing device to determine if a fan associated with the uninterruptible power supply is functioning.

5. The system of claim 1, wherein the uninterruptible power supply and the one or more power supplies are in a parallel configuration.

6. The system of claim 1, wherein the uninterruptible power supply and the one or more power supplies actively current share.

7. The system of claim 1, wherein the uninterruptible power supply and the one or more power supplies passively current share.

8. The system of claim 1, wherein the uninterruptible power supply comprises a current measuring circuit.

9. The system of claim 1, wherein at least one of the total output current and the output current of the uninterruptible power supply is based on an average of multiple measurements over a time period.

10. A non-transitory computer-readable medium including instructions stored therein that when executed cause a processing device to:
    enable an uninterruptible power supply capable of providing power via internal cells in response to a power failure or power sag, wherein the uninterruptible power supply is capable of taking over a full load from one or more power supplies;
    iteratively disable at least one of the one or more power supplies while allowing at least one of the one or more power supplies to remain enabled;
    determine an output current of the uninterruptible power supply after the at least one power supply is disabled;
    determine a current sharing percentage for the uninterruptible power supply;
    compare the current sharing percentage for the uninterruptible power supply with an expected current sharing percentage range based on an amount of the at least one or more enabled power supplies; and
    determine if the uninterruptible power supply is functioning based at least in part on a result of comparing the current sharing percentage for the uninterruptible power supply with the expected current sharing percentage range.

11. The non-transitory computer-readable medium of claim 10, wherein the instructions further cause the processing device to determine if one or more components associated with the uninterruptible power supply are functioning.

12. The non-transitory computer-readable medium of claim 10, wherein the instructions further cause the processing device to
    disable a power supply;
    determine a second output current of the uninterruptible power supply;
    determine a second current sharing percentage for the uninterruptible power supply; and
    compare the second current sharing percentage for the uninterruptible power supply with a second expected current sharing percentage range.

13. The non-transitory computer-readable medium of claim 12, wherein the instructions further cause the processing device to determine if the uninterruptible power supply is functioning based at least in part on a result of comparing the second current sharing percentage for the uninterruptible power supply with the second expected current sharing percentage range.

14. The non-transitory computer-readable medium of claim 10, wherein the instructions further cause the processing device to determine a total output current for one or more power supplies.

15. The non-transitory computer-readable medium of claim 10, wherein the expected current sharing percentage range is stored in the non-transitory computer-readable medium.

16. A method for testing an uninterruptible power supply, comprising:
    enabling, by a processing device, the uninterruptible power supply capable of providing power via internal cells in response to a power failure or power sag, wherein the uninterruptible power supply is capable of taking over a full load from one or more power supplies;
    iteratively disabling at least one of the one or more power supplies while allowing at least one power supply to remain enabled;
    determining an output current of the uninterruptible power supply after the at least one power supply is disabled;
    determining a current sharing percentage for the uninterruptible power supply based at least in part on the output current of the uninterruptible power supply;
    retrieving an expected current sharing percentage range for the uninterruptible power supply; and
    comparing the current sharing percentage for the uninterruptible power supply with the expected current sharing percentage range based on an amount of the at least one or more enabled power supplies.

17. The method of claim 16, wherein determining the output current of the uninterruptible power supply comprises receiving a plurality of output current measurements and averaging the plurality of output current measurements.

18. The method of claim 16, wherein determining the current sharing percentage for the uninterruptible power supply comprises dividing the output current from the uninterruptible power supply by a total output current.

19. The method of claim 16, further comprising determining that the uninterruptible power supply is not functioning properly if the current sharing percentage for the uninterruptible power supply is not consistent with the expected current sharing percentage range.

20. The method of claim 16, further comprising causing an indication to be provided if the current sharing percentage for the uninterruptible power supply is not consistent with the expected current sharing percentage range.

\* \* \* \* \*